US008179686B2

(12) United States Patent
Sakatani et al.

(10) Patent No.: US 8,179,686 B2
(45) Date of Patent: May 15, 2012

(54) MOUNTED STRUCTURAL BODY AND METHOD OF MANUFACTURING THE SAME

(75) Inventors: Shigeaki Sakatani, Osaka (JP); Atsushi Yamaguchi, Osaka (JP); Koso Matsuno, Osaka (JP); Hidenori Miyakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 381 days.

(21) Appl. No.: 12/259,661

(22) Filed: Oct. 28, 2008

(65) Prior Publication Data

US 2009/0120675 A1 May 14, 2009

(30) Foreign Application Priority Data

Nov. 9, 2007 (JP) ................................. 2007-291504

(51) Int. Cl.
*H05K 7/00* (2006.01)

(52) U.S. Cl. ........ 361/760; 361/762; 174/260; 174/390; 174/522; 174/539; 257/666; 257/668; 257/734; 257/778

(58) Field of Classification Search .................. 361/760, 361/762, 761; 174/260, 390, 522, 539; 257/687, 257/778, 787, 666, 668, 734
See application file for complete search history.

(56) References Cited

U.S. PATENT DOCUMENTS

| | | | | |
|---|---|---|---|---|
| 4,975,761 A * | 12/1990 | Chu | .............................. | 257/686 |
| 5,016,986 A * | 5/1991 | Kawashima et al. | ......... | 349/138 |
| 5,517,056 A * | 5/1996 | Bigler et al. | ................... | 257/666 |
| 5,717,252 A * | 2/1998 | Nakashima et al. | .......... | 257/707 |
| 5,981,873 A * | 11/1999 | Heo | ............................... | 174/522 |
| 5,999,413 A * | 12/1999 | Ohuchi et al. | ................ | 361/772 |
| 6,020,626 A * | 2/2000 | Ohsawa et al. | ................ | 257/668 |
| 6,214,643 B1 * | 4/2001 | Chiu | ............................ | 438/108 |
| 6,319,749 B1 * | 11/2001 | Shigeta et al. | ................ | 438/106 |
| 6,566,234 B1 * | 5/2003 | Capote et al. | ................. | 438/458 |
| 6,590,275 B2 * | 7/2003 | Fujisawa et al. | .............. | 257/666 |
| 6,627,997 B1 * | 9/2003 | Eguchi et al. | ................. | 257/777 |
| 6,670,220 B2 * | 12/2003 | Sakuraba et al. | ............. | 438/109 |
| 6,717,279 B2 * | 4/2004 | Koike | ........................... | 257/787 |
| 6,731,010 B2 * | 5/2004 | Horiuchi et al. | .............. | 257/777 |
| 6,897,093 B2 * | 5/2005 | Kasuga et al. | ................ | 438/112 |
| 6,924,548 B2 * | 8/2005 | Hasebe et al. | ................ | 257/674 |

(Continued)

FOREIGN PATENT DOCUMENTS

JP 08-162497 6/1996

(Continued)

OTHER PUBLICATIONS

Chinese Office Action issued in Chinese Patent Application No. CN 200810174141X dated Oct. 9, 2009.

*Primary Examiner* — Xiaoliang Chen

(74) *Attorney, Agent, or Firm* — McDermott Will & Emery LLP

(57) ABSTRACT

Including a wiring board having an electronic component mounted at least on a first surface, a resin applied at least between the electronic component and the wiring board, and a through-hole provided in a region corresponding to the mounting position of the electronic component in the wiring board, a protrusion is formed on the wiring board so as to overlap at least with the electronic component, around a region corresponding to the mounting position of the electronic component.

12 Claims, 9 Drawing Sheets

U.S. PATENT DOCUMENTS

| | | | |
|---|---|---|---|
| 6,940,162 B2 * | 9/2005 | Eguchi et al. | 257/723 |
| 6,949,815 B2 * | 9/2005 | Yamazaki et al. | 257/682 |
| 6,987,058 B2 * | 1/2006 | Hall | 438/617 |
| 7,053,494 B2 * | 5/2006 | Seko | 257/784 |
| 7,084,474 B2 * | 8/2006 | Hung et al. | 257/434 |
| 7,116,391 B2 * | 10/2006 | Kim | 349/149 |
| 7,166,908 B2 * | 1/2007 | Minamio et al. | 257/680 |
| 7,282,396 B2 * | 10/2007 | Danno et al. | 438/123 |
| 7,531,441 B2 * | 5/2009 | Kado et al. | 438/612 |
| 7,545,049 B2 * | 6/2009 | Sunohara et al. | 257/778 |
| 7,563,987 B2 * | 7/2009 | Sunohara et al. | 174/260 |
| 7,674,987 B2 * | 3/2010 | Kodama et al. | 174/260 |
| 7,783,141 B2 * | 8/2010 | Kodama et al. | 385/14 |
| 7,907,801 B2 * | 3/2011 | Kodama et al. | 385/14 |
| 7,919,849 B2 * | 4/2011 | Kodama et al. | 257/698 |
| 2002/0031867 A1 * | 3/2002 | Horiuchi et al. | 438/125 |
| 2002/0036345 A1 * | 3/2002 | Iseki et al. | 257/734 |
| 2002/0064935 A1 * | 5/2002 | Honda | 438/622 |
| 2003/0071348 A1 * | 4/2003 | Eguchi et al. | 257/723 |
| 2003/0127711 A1 * | 7/2003 | Kawai et al. | 257/666 |
| 2004/0251540 A1 * | 12/2004 | Eguchi et al. | 257/713 |
| 2005/0179119 A1 * | 8/2005 | Lien | 257/666 |
| 2006/0003494 A1 * | 1/2006 | Li | 438/124 |
| 2006/0169486 A1 * | 8/2006 | Funada et al. | 174/254 |
| 2006/0170085 A1 * | 8/2006 | Fukuta et al. | 257/676 |
| 2007/0278645 A1 * | 12/2007 | Li | 257/686 |
| 2008/0170819 A1 * | 7/2008 | Kodama et al. | 385/14 |
| 2008/0236876 A1 * | 10/2008 | Kodama et al. | 174/260 |
| 2008/0247703 A1 * | 10/2008 | Kodama et al. | 385/14 |
| 2008/0247704 A1 * | 10/2008 | Kodama et al. | 385/14 |
| 2009/0016671 A1 * | 1/2009 | Asai et al. | 385/14 |

FOREIGN PATENT DOCUMENTS

| | | |
|---|---|---|
| JP | 11-284104 | 10/1999 |
| JP | 11-345918 | 12/1999 |
| JP | 2003-008233 | 1/2003 |
| JP | 2004-023045 | 1/2004 |
| JP | 2006-286782 | 10/2006 |
| JP | 2007-242641 | 9/2007 |

* cited by examiner

MOUNTED STRUCTURAL BODY AND METHOD OF MANUFACTURING THE SAME

BACKGROUND OF THE INVENTION

1. Field of the Invention

The present invention relates to a mounted structural body having semiconductor chips or other electronic components mounted on a wiring board, and a method of manufacturing the same.

2. Background Art

Recently, electronic components are rapidly advanced in function, and reduced in size and weight. In the mounting method of semiconductor chips in package, too, demands for reduction of size, weight and thickness are increasing.

To solve the problems, as the technology for mounting semiconductor chips on the wiring board, the wire bonding technology is being replaced by the flip-chip technology of forming protruding electrodes on the surface of a semiconductor chip by using solder or gold wire, and connecting with the wiring board. The flip-chip technology is generally a technology of mounting a semiconductor chip on one side of a wiring board having a wiring pattern by way of protruding electrodes, filling the gaps of the semiconductor chip and the wiring board by pouring in a resin called under-fill, and fixing the semiconductor chip and the wiring board integrally. By this resin, the function surface of the semiconductor chip is protected, and a stable connection is realized.

Hitherto, as shown in FIG. 10A to FIG. 10D, a mounted structural body filled with a resin as under-fill has been generally known.

FIG. 10A to FIG. 10D are sectional views for explaining the resin injection method between the wiring board and the semiconductor chip of a conventional mounted structural body. In the mounted structural body, on pads 106 of wiring board 100 forming pads 106 and wiring patterns 161 at least on one side, semiconductor chip 104 is mounted on one side by way of solders 105. At this time, on wiring patterns 161 and the regions other than pads 106, insulation films 107, 171 made of resist or the like are formed.

First, as shown in FIG. 10A, using dispenser 108, resin 103 is injected from one position on the periphery where semiconductor chip 104 is mounted on wiring board 100. At this time, resin 103 spreads concentrically from dispenser 108 as indicted by dotted lines in FIG. 10B, and is injected into the gaps toward the outer circumference of semiconductor chip 104 as indicated by arrows.

Consequently, as shown in FIG. 10C, resin 103 is injected while spreading inside from the gaps between wiring board 100 and semiconductor chip 104.

As a result, as shown in FIG. 10D, the entire gaps between wiring board 100 and semiconductor chip 104 are filled with resin 103, which is cured, and then semiconductor chip 104 and wiring board 100 are integrally bonded.

In this method, the mounted structural body mounting the semiconductor chip on the wiring board is realized.

In this mounted structural body, however, steps are formed by wiring pattern 161 and insulation film 171, for example, or solder flux of non-cleaning type recently used for enhancing the productivity may be left over in the gaps as residues, and the flow of injected resin 103 may be partly disturbed and may be non-uniform. Accordingly, as shown in FIG. 10D, spaces 109 or voids not filled with resin 103 are left over, and the bond strength or peel strength may be reduced.

Besides, since resin 103 is injected from one position, as shown in FIG. 10D, region 110 not filled with resin 103 may be formed somewhere on the entire circumference of wiring board 100 and semiconductor chip 104. This is because resin 103 is injected concentrically as shown in FIG. 10B, and may not reach completely from the injection side to the opposite side end of semiconductor chip 104 due to presence of steps and residues. As a result, part of end or periphery of semiconductor chip 104 may not be bonded by resin 103, and semiconductor chip 104 may be peeled off or broken due to deformation stress from outside, or warp due to difference in coefficient of thermal expansion between semiconductor chip 104 and wiring board 100, and thereby the reliability may be lowered.

To avoid such inconveniences, Unexamined Japanese Patent Publication No. 2006-351559 (hereinafter called patent document 1) discloses a semiconductor chip mounting structure, in which a frame-like resin dam larger than the mounting area of a semiconductor chip is formed, and the under-fill resin is injected by a dispenser while moving on the circumference along one side of the semiconductor chip within this dam.

Further, Unexamined Japanese Patent Publication No. 2003-249603 (hereinafter called patent document 2) discloses an electronic device in which a frame-like step part having a recess smaller than the outer size of a circuit element is fixed on the surface of a board, and the confronting circumference of the circuit element and the step part is filled with a sealing resin.

However, in the semiconductor chip mounting structure of patent document 1, strict process conditions such as moving accuracy of the dispenser and stability of injection amount are needed together with complicated mechanism and equipment, and the productivity may be lowered.

According to the electronic device of patent document 2, it is only intended to realize a structure in which the sealing resin does not flow into the functional parts of the circuit element, and nothing is suggested about the structure of fixing between the opposite electronic component and wiring board by securely filling with under-fill resin, especially about the injection method.

SUMMARY OF THE INVENTION

The mounted structural body of the present invention includes a wiring board having an electronic component mounted at least on a first surface, a resin applied at least between the electronic component and the wiring board, and a through-hole provided in a region corresponding to the mounting position of the electronic component in the wiring board, in which a protrusion is formed on the wiring board so as to overlap at least with the electronic component, around a region corresponding to the mounting position of the electronic component.

In this configuration, the gap between the outer circumference of the electronic component and the wiring board can be securely bonded with the resin, and a mounted structural body excellent in reliability is realized.

The manufacturing method of a mounted structural body of the present invention includes forming a frame-like protrusion overlapping with the periphery of an electronic component in a region corresponding to the mounting position of the electronic component at least on a first surface of a wiring board and a through-hole in the region, mounting the electronic component in the region, injecting a resin between the electronic component and the wiring board from a gap of the protrusion and the electronic component, and heating the resin.

By this method, the gap between the outer circumference of the electronic component and the wiring board can be securely bonded with the resin, and a mounted structural body excellent in reliability is manufactured at high productivity.

DETAILED DESCRIPTION OF THE INVENTION

Figure 1A:
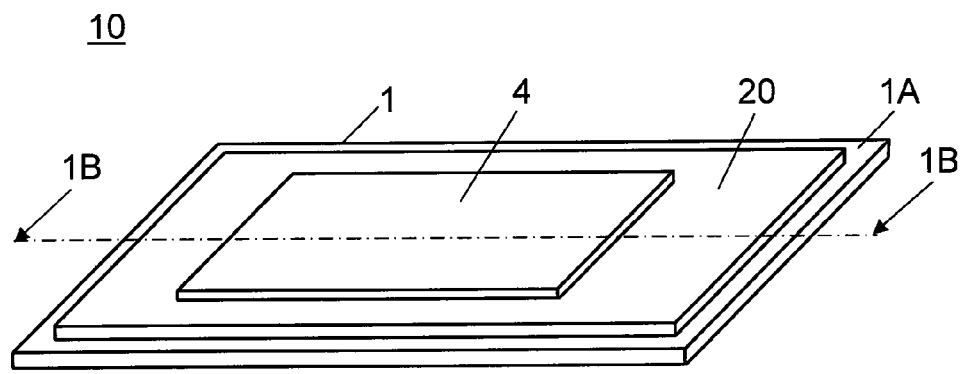
FIG. 1A is a perspective outline view of configuration of a mounted structural body in a first exemplary embodiment of the present invention.

Exemplary embodiments of the present invention are specifically described below while referring to the accompanying drawings. In the drawings, same elements are identified with same reference numerals, and the repeated explanation may be omitted.

First Exemplary Embodiment

Figure 1B:
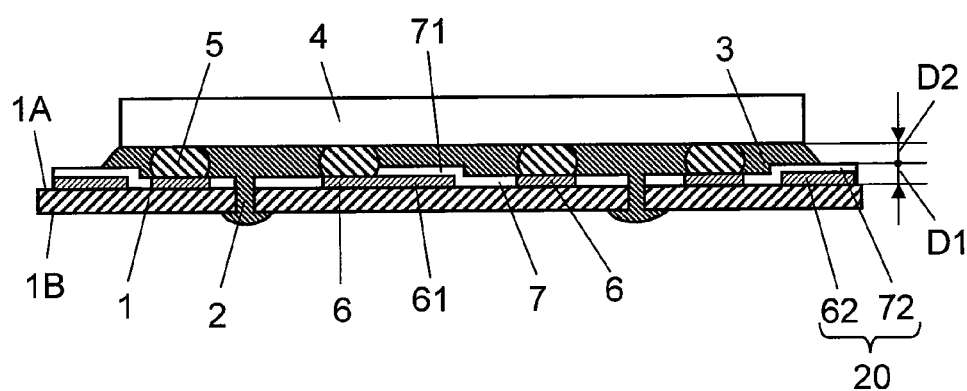
FIG. 1B is a sectional view along line 1B-1B in FIG. 1A.
Figure 2A:
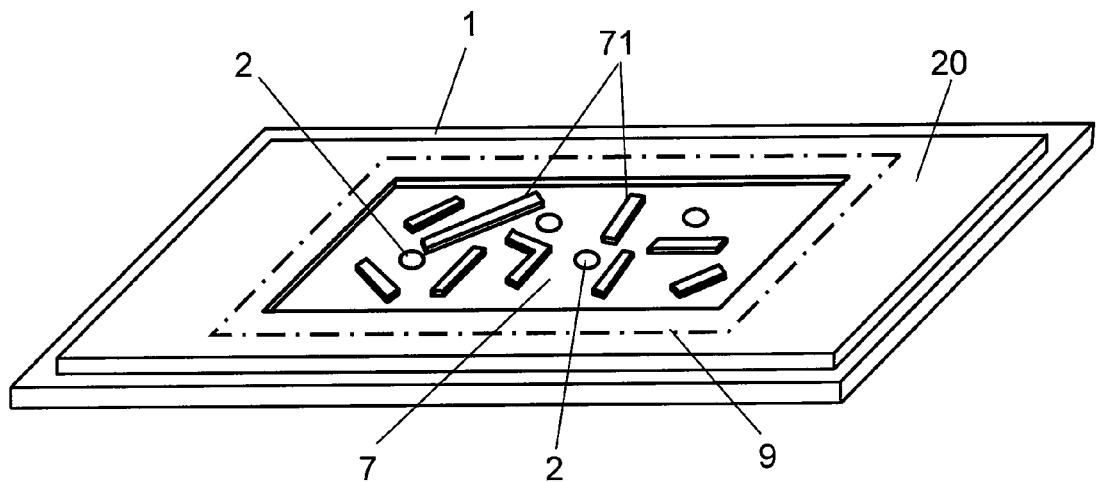
FIG. 2A is a perspective outline view explaining a wiring board for composing the mounted structural body in the first exemplary embodiment of the present invention.
Figure 2B:
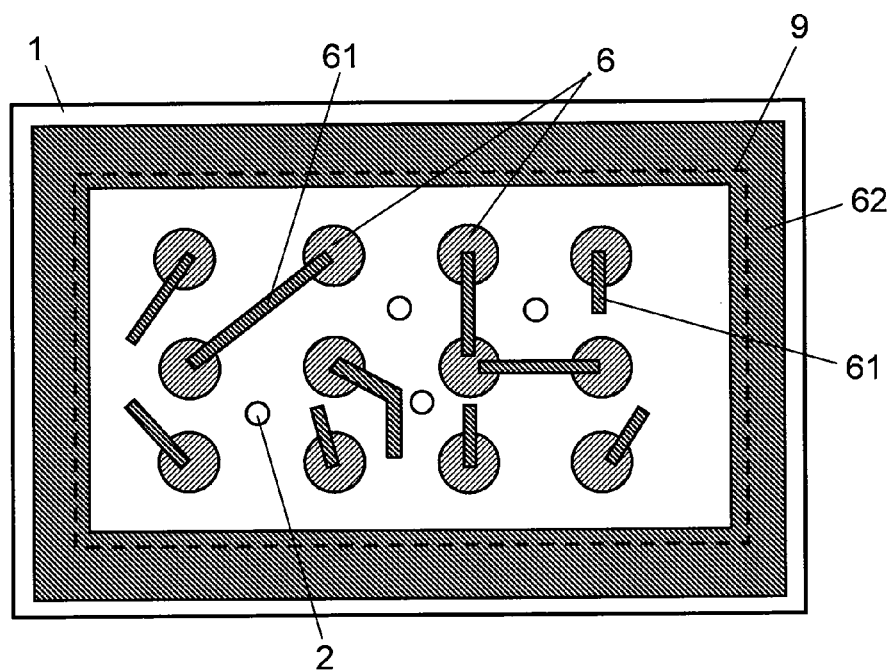
FIG. 2B is a plan view excluding the insulation film of the wiring board in FIG. 2A.

FIG. 1A is a perspective outline view of configuration of a mounted structural body in a first exemplary embodiment of the present invention. FIG. 1B is a sectional view along line 1B-1B in FIG. 1A. FIG. 2A is a perspective outline view explaining a wiring board for composing the mounted structural body in the first exemplary embodiment of the present invention. FIG. 2B is a plan view excluding the insulation film of the wiring board in FIG. 2A.

As shown in FIG. 1A and FIG. 1B, mounted structural body 10 is composed of electronic component 4 mounted at least on first surface 1A of wiring board 1, solder 5 for electrically connecting between electronic component 4 and wiring board 1, and resin 3 for bonding them all.

At this time, wiring board 1 includes, as shown in FIG. 2B, pad 6 and wiring pattern 61 connected by way of solder 5, and peripheral conductor part 62 provided so as to overlap with the outer circumference of electronic component 4 at least on the periphery of region 9 (dotted line in the drawing) corresponding to through-hole 2 and the mounting position of electronic component 4. Meanwhile, peripheral conductor part 62 may be a dummy electrode not contributing electric connection, and may be functioned as a grounding electrode. Further, by partially cutting off the peripheral conductor part, a wiring pattern for connecting with the outside may be provided between them. When the peripheral conductor part is provided on the entire circumference, it may be connected with the outside by the wiring pattern of inner layer of the wiring board.

"Further, protrusion 20 is formed, for example, in a square frame shape of peripheral conductor part 62 and insulation film 72 such as resist for covering it as shown in FIG. 1B and FIG. 2A. Similarly, wiring pattern 61 of wiring board 1 is covered with insulation film 71 such as resist and is formed. That is, peripheral conductor part 62 of protrusion 20 is formed at the same step and of the same conductive material as wiring pattern 61. Hence, extra new step is not needed as explained in the manufacturing method below. Further, at least a portion of protrusion 20 overlaps at least with a portion of a lower surface of electronic component 4, as shown in FIG. 1B."

Through-hole 2 provided in wiring board 1 is filled with injected resin 3. At this time, in order to increase the bond strength of electronic component 4 and wiring board 1, as shown in FIG. 1B, resin 3 may extended up to the side of second surface 1B of wiring board 1 by way of through-hole 2, but it is not particularly limited.

As wiring board 1, for example, a glass epoxy board of a single layer or multiple layers of high Tg type and low coefficient of linear expansion may be used. As resin 3, an epoxy resin containing filler by 55% having, for example, elasticity of 3 GPa, glass transition temperature of 150° C. (as measured by dynamic viscoelasticity) and average particle size of 2 μm may be used. Electronic component 4 is, for example, semiconductor package such as LGA (land grid array) of about 1 mm in thickness, QFP (quad flat package), TCP (tape carrier package), TSOP (thin small outline package), or the like, bare semiconductor chip, or other general-purpose component. Wiring pattern 61 may be formed on first surface 1A of wiring board 1 alone, or may be provided in inner layers of multi-layer structure, and may be connected by way of conductive through-hole 2 or via hole (not shown).

The manufacturing method of mounted structural body in the first exemplary embodiment of the present invention is described below while referring to the drawing.

FIG. 3A to FIG. 3D are sectional views explaining the manufacturing method of the mounted structural body in the first exemplary embodiment of the present invention.

Figure 3A:
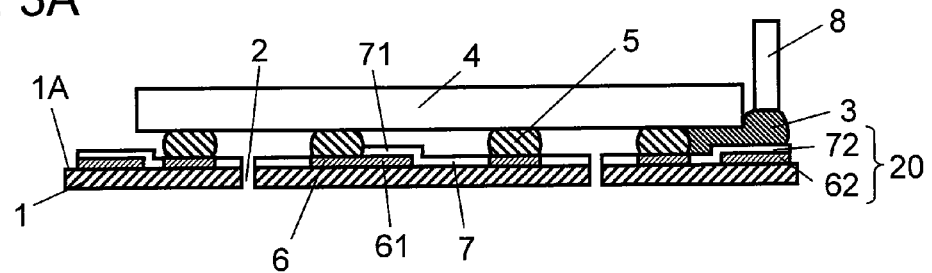
FIG. 3A is a sectional view explaining a manufacturing method of the mounted structural body in the first exemplary embodiment of the present invention.
Figure 3B:
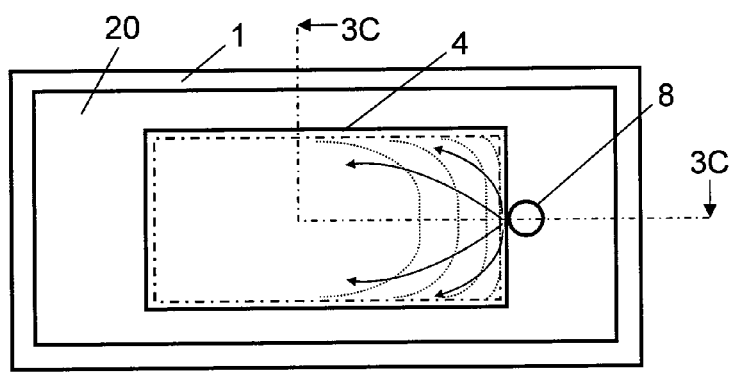
FIG. 3B is a sectional view explaining a manufacturing method of the mounted structural body in the first exemplary embodiment of the present invention.

First, as shown in FIG. 3A, on first surface 1A of wiring board 1 made of, for example, glass epoxy board, through-hole 2 is formed by punching or laser processing in a region corresponding to the mounting position of at least an electronic component to be mounted in the following steps. By photolithography, for example, pads 6, wiring pattern 61 and peripheral conductor part 62 is formed on the entire circumference of specified positions overlapping at least outer periphery of the electronic component to be mounted on the wiring board, by vapor deposition method or sputtering method, or by etching after adhering copper foil or the like.

To cover at least wiring pattern 61 and peripheral conductor part 62, insulation films 7, 71, 72 such as resist are formed, for example, by photolithography.

As a result, at least at the position overlapping with the outer circumference of the electronic component, protrusion 20 formed of peripheral conductor part 62 and insulation film 72 is formed at uniform gaps (intervals), at height D1 of about 40 μm as shown in FIG. 1B.

At this time, preferably, the thickness of insulation film 72 of peripheral conductor part 62 is larger than the thickness of insulation film 71 of wiring pattern 61. However, in the region of mounting of electronic component 4, the gap of the electronic component and the wiring board may be narrower at the position of protrusion 20 than the region other than protrusion 20.

Next, by screen printing or other method, solder paste of, for example, Sn-3Ag-0.5Cu, is applied on pad 6 of wiring board 1, and ball-shaped solder 5 is formed.

Further, by positioning and mounting electrodes (not shown) of electronic component 4 such as semiconductor package and pad 6 of wiring board 1, and re-flowing, electronic component 4 is bonded to wiring board 1 by way of solder 5. At this time, a gap D2 (FIG. 1B) between protrusion 20 of wiring board 1 and electronic component 4 is, for example, 60 μm, which is narrower than the internal gap of wiring board 1 and electronic component 4 by the portion of thickness (height) of at least insulation film 72.

Using dispenser 8, from one position on protrusion 20 surrounding the mounting position of electronic component 4 on wiring board 1, resin 3 such as epoxy resin is dropped, and injected by making use of capillary phenomenon. At this time, resin 3 spreads in directions indicated by arrows along the region overlapping with electronic component 4 and protrusion 20 (between single-dot chain line and inside solid line) as indicated by dotted line in FIG. 3B, and is injected into the gap of electronic component 4 and wiring board 1 and into the gap of protrusion 20 and electronic component 4. Since the gap of the protrusion and the electronic component is narrower than the inside gap, and is formed uniformly on the whole circumference of the electronic component, and hence the resin flows by capillary phenomenon, and injected smoothly along the overlapping region of the electronic component and the protrusion.

Figure 3C:
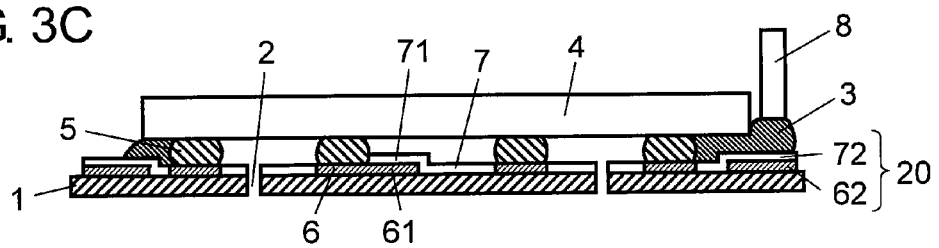
FIG. 3C is a sectional view explaining a manufacturing method of the mounted structural body in the first exemplary embodiment of the present invention.

As shown in FIG. 3C, resin 3 fills up the overlapping gap between protrusion 20 of wiring board 1 and electronic component 4, and further spreads and injected into the inside gap of electronic component 4 and wiring board 1. FIG. 3C is a sectional view along line 3C-3C in FIG. 3B.

Figure 3D:
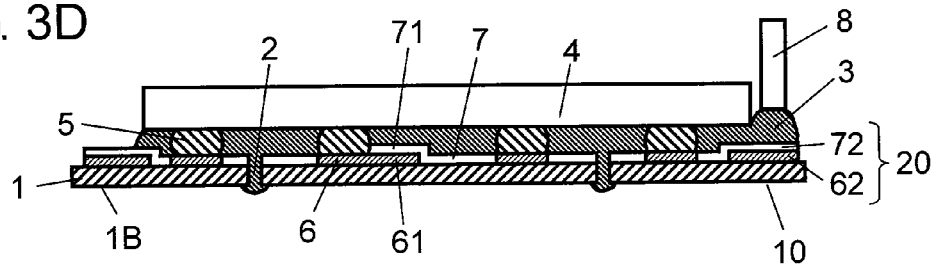
FIG. 3D is a sectional view explaining a manufacturing method of the mounted structural body in the first exemplary embodiment of the present invention.

Finally as shown in FIG. 3D, resin 3 is injected into the entire gap of wiring board 1 and electronic component 4, and is cured, so that electronic component 4 and wiring board 1 are integrally bonded.

In this method, mounted structural body 10 mounting the electronic component at least on the first surface of the wiring board is realized.

According to the exemplary embodiment, the resin first flows into the gap between the protrusion of the wiring board and the electronic component, and then the resin flows into the inside gap. As a result, the resin is securely injected into the peripheral parts of the outer circumference of the electronic component, and the bond strength and the peel strength of the electronic component and the wiring board are enhanced, and the mounted structural body excellent in connection reliability is realized.

Figure 4:
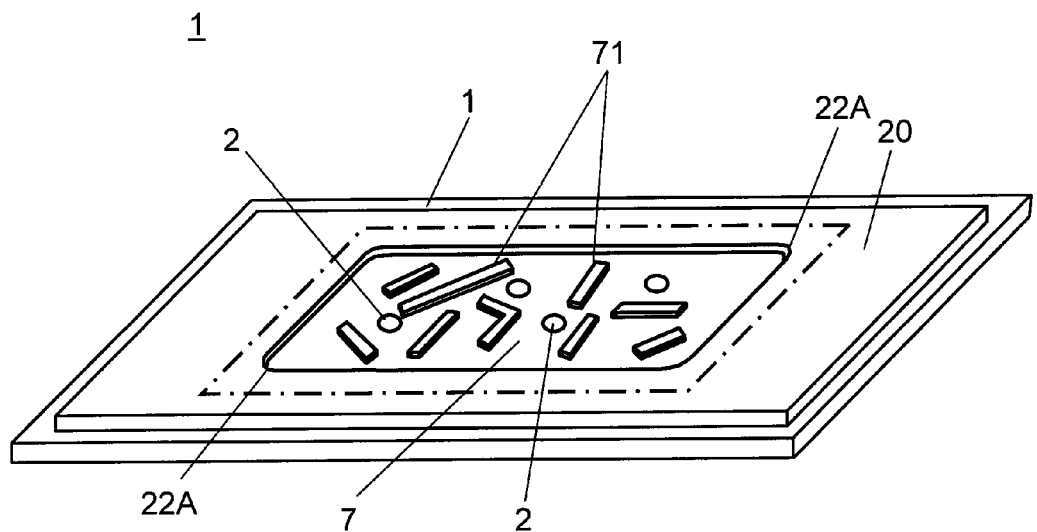
FIG. 4 is a perspective view explaining a first example of wiring board of the mounted structural body in the first exemplary embodiment of the present invention.
Figure 5:
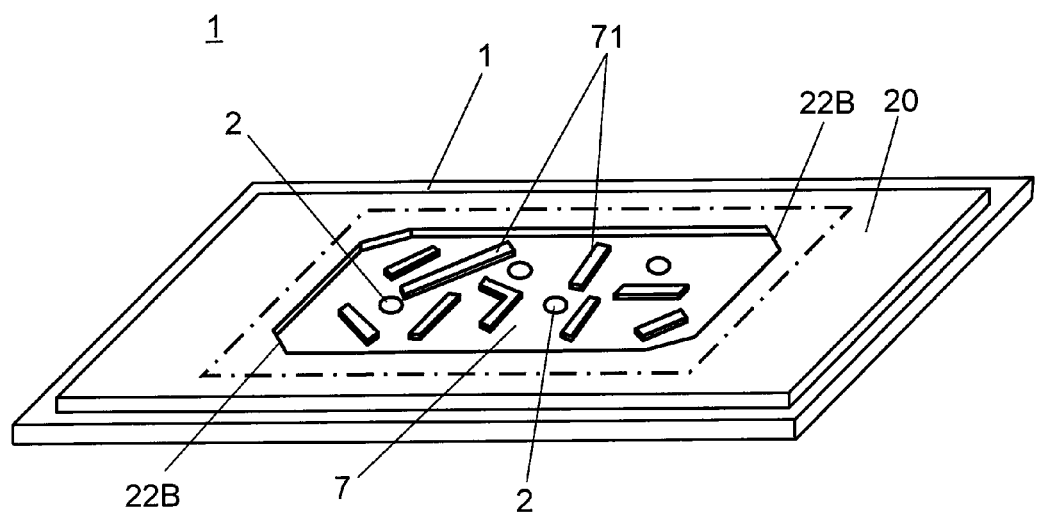
FIG. 5 is a perspective view explaining a second example of wiring board of the mounted structural body in the first exemplary embodiment of the present invention.

In this exemplary embodiment, the protrusion is shown in a square frame shape, but it is not particularly limited. For example, as shown in a perspective view of FIG. 4 explaining a first example of the wiring board, the corners of the inner circumference of the square frame shape may be formed in curved parts 22A. Curved parts 22A are, for example, ¼ circular shape. Or, as shown in a perspective view of FIG. 5 explaining a second example of the wiring board, the corners of the inner circumference of the square frame shape may be formed in flat parts 22B by flattening in reverse shape of chamfering. Hence, by using dispenser 8 shown in FIG. 3B, the resin injected from one position flows along corners more smoothly at curved parts 22A or flat parts 22B, and is injected evenly and uniformly along the outer circumference of the electronic component.

In the exemplary embodiment, the resin is injected at ordinary temperature, but it is not limited. For example, after connecting the electronic component and the wiring board, the resin may be heated to a temperature lower than curing point (for example, about 40° C.), and then injected. As a result, the fluidity of the resin is improved, and the injection speed can be raised, and the productivity is enhanced.

In the exemplary embodiment, the gap D2 between the protrusion of the wiring board and the electronic component is 60 μm, but it is not limited. The gap is arbitrary from 30 μm to 80 μm, preferably 40 μm to 70 μm, and it may be set properly depending on the viscosity of the resin or injection temperature. However, if the gap D2 is too wide, the flow of the resin along the gap is slow, and the resin may not be injected into the whole circumference of the electronic component, and hence the specified range is preferred.

In the exemplary embodiment, the protrusion is formed along the whole circumference of the outer periphery of the electronic component at uniform height (thickness), but it is not limited. For example, in part of the protrusion, a lower portion may be provided at one or more positions. The lower portions may be formed by not forming at least one of the insulation film and the peripheral conductor part. As a result, together with through-hole 2, when injecting the resin, the inside air can be easily forced out, and formation of voids can be prevented. Accordingly, the lower portions of the protrusion are preferred to be formed at different positions apart from the resin injection position, for example, at the opposite position of the injection position.

In the exemplary embodiment, the peripheral conductor part of the protrusion is formed simultaneously with the pad or wiring pattern formed in the wiring board, but it is not limited. For example, copper foils different in thickness are adhered, and removed by etching, so that the peripheral conductor part may be formed in a thickness (greater thickness) different from the thickness of the pad or wiring pattern. As a result, the mechanical strength of the wiring board against deformation or warp by external stress can be enhanced.

Second Exemplary Embodiment

Figure 6A:
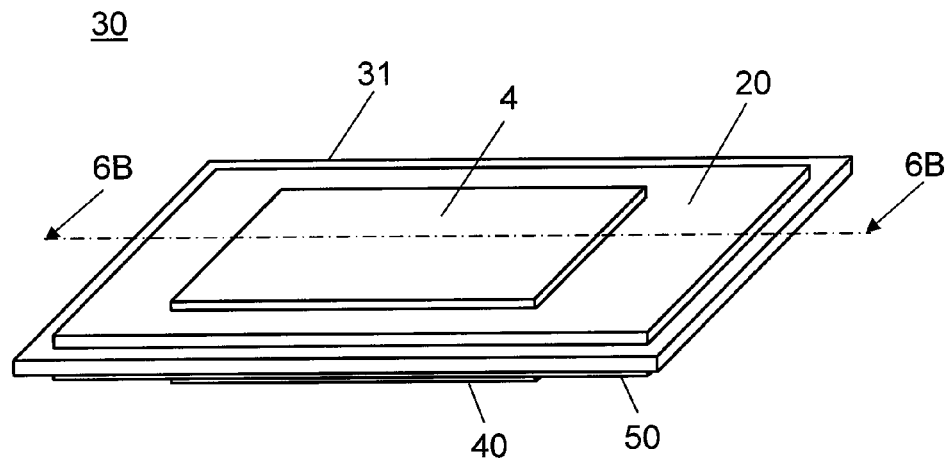
FIG. 6A is a perspective outline view of configuration of a mounted structural body in a second exemplary embodiment of the present invention.
Figure 6B:
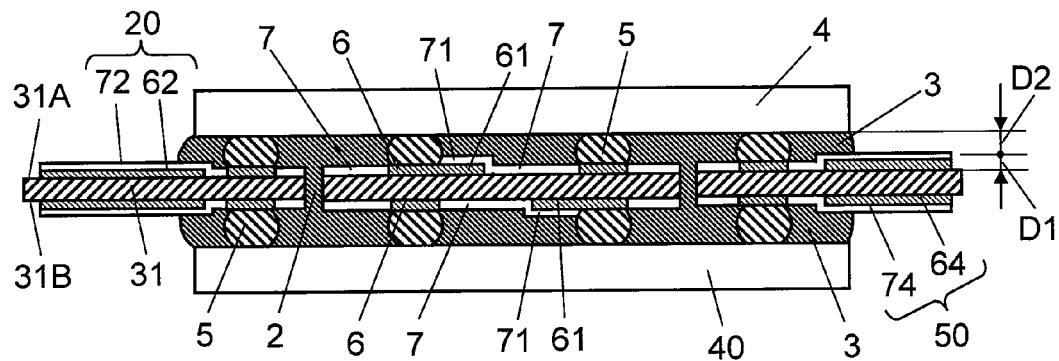
FIG. 6B is a sectional view along line 6B-6B in FIG. 6A.

FIG. 6A is a perspective outline view of configuration of a mounted structural body in a second exemplary embodiment of the present invention, and FIG. 6B is a sectional view along line 6B-6B in FIG. 6A.

As shown in FIG. 6A and FIG. 6B, this is different from the first exemplary embodiment in that an electronic component and a protrusion are further provided on a second surface of the wiring board. In the following explanation, electronic component 4 of the first exemplary embodiment is shown as first electronic component 4 and protrusion 20 as first protrusion 20, and the electronic component of the second exemplary embodiment is shown as second electronic component 40, and the protrusion as second protrusion 50.

That is, as shown in FIG. 6A and FIG. 6B, mounted structural body 30 is composed of first electronic component 4 mounted on first surface 31A of wiring board 31, second electronic component 40 mounted on second surface 31B, solder 5 for electrically connecting first electronic component 4, second electronic component 40, and wiring board 31, and resin 3 for bonding them integrally by way of through-hole 2.

At this time, first surface 31A and second surface 31B of wiring board 31 are provided with pad 6 and wiring pattern 61 connected through solder 5, and through-hole 2, first protrusion 20 and second protrusion 50 disposed so as to be overlapped with the outer circumference of first electronic component 4 and second electronic component 40 at least around the region (not shown) corresponding to the mounting position of first electronic component 4 and second electronic component 40. As shown in FIG. 6B, first protrusion 20 is formed, for example, in a square frame shape of peripheral conductor part 62 and insulation film 72 such as resist for covering it. Similarly, second protrusion 50 is formed, for example, in a square frame shape of peripheral conductor part 64 and insulation film 74 such as resist for covering it. Further, wiring pattern 61 formed in first surface 31A and second surface 31B of wiring board 31 is covered with insulation film 71 such as resist and is formed. At this time, same as in the first exemplary embodiment, peripheral conductor part 62 of first protrusion 20 and peripheral conductor part 64 of second protrusion 50 are formed at the same step and of the same conductive material as wiring pattern 61. Hence, extra new step is not needed as explained in the manufacturing method below.

Resin 3 injected into the gap between wiring board 31, first electronic component 4 and second electronic component 40 bonds them integrally by way of through-hole 2 provided in wiring board 31. Other component elements and materials are same as in the first exemplary embodiment, and the explanation is omitted.

The manufacturing method of mounted structural body in the second exemplary embodiment of the present invention is described below while referring to the drawing.

FIG. 7A to FIG. 7D are sectional views explaining the manufacturing method mounted structural body 30 in the second exemplary embodiment of the present invention. FIG. 8 is a flowchart explaining the manufacturing method mounted structural body 30 in the second exemplary embodiment of the present invention.

Figure 7A:
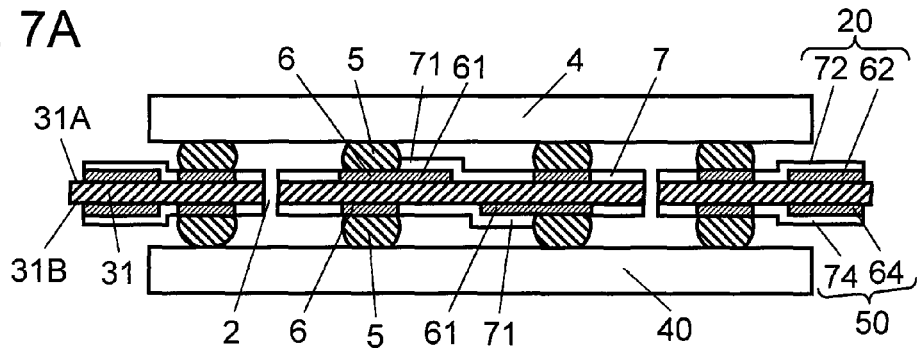
FIG. 7A is a sectional view explaining a manufacturing method of the mounted structural body in the second exemplary embodiment of the present invention.
Figure 8:
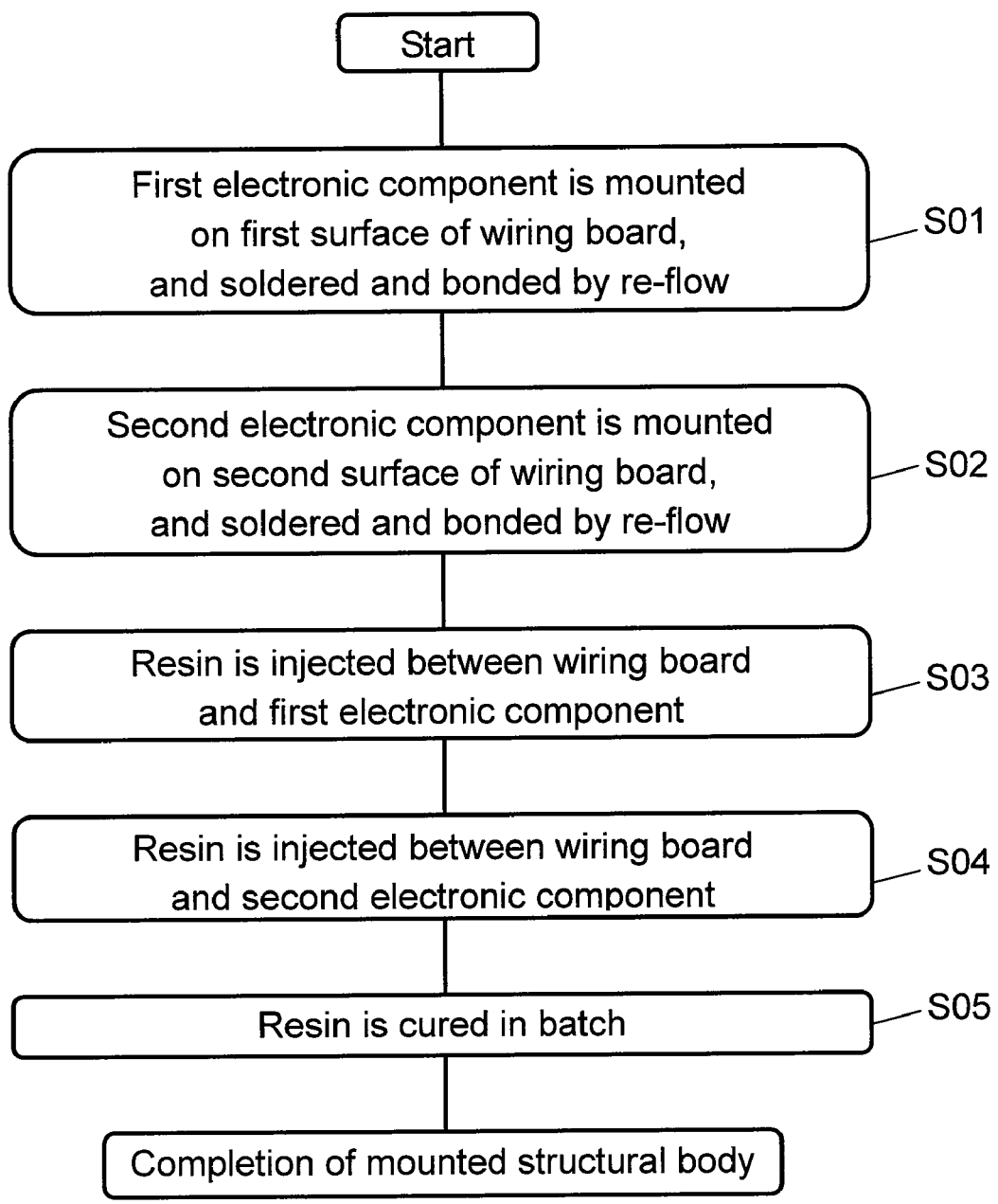
FIG. 8 is a flowchart explaining a manufacturing method of the mounted structural body in the second exemplary embodiment of the present invention.

First, as shown in FIG. 7A and FIG. 8, on first surface 31A and second surface 31B of wiring board 31 in thickness of about 0.4 mm of, for example, glass epoxy board, through-hole 2 is formed in a region corresponding to the mounting position of first electronic component 4 and second electronic component 40 to be mounted in the following steps. At this time, through-hole 2 is formed in an outside diameter of 0.15 mm by, for example, punching process or laser process. By photolithography, for example, pad 6, wiring board 61 and peripheral conductor parts 62, 64 are formed on the entire circumference of specified positions overlapping at least outer periphery of first electronic component 4 and second electronic component 40 to be mounted on wiring board 61, by vapor deposition method or sputtering method, or by etching after adhering copper foil or the like.

To cover at least wiring pattern 61 and peripheral conductor part 62 on first surface 31A and peripheral conductor part 62 on second surface 31B, insulation films 7, 71, 72, 74 such as resist are formed, for example, by photolithography.

As a result, at the position overlapping with the outer circumference of the first electronic component, first protrusion 20 formed of peripheral conductor part 62 and insulation film 72 is formed at uniform gaps (intervals), at height D1 of about 40 μm as shown in FIG. 6B. Similarly, at the position overlapping with the outer circumference of the second electronic component, second protrusion 50 formed of peripheral conductor part 64 and insulation film 74 is formed at uniform gaps (intervals), at height D1 of about 40 μm.

At this time, preferably, the thickness of insulation films 72, 74 of peripheral conductor parts 62, 64 is larger than the thickness of insulation film 71 of wiring pattern 61, but in the region of mounting of first electronic component 4 and second electronic component 40, the gap of first electronic component 4 and the wiring board 31, second electronic component 40 and the wiring board 31 may be narrower at the position of first protrusion 20 and second protrusion 50 than the region other than first protrusion 20 and second protrusion 50.

Next, by screen printing or other method, solder paste of, for example, Sn-3Ag-0.5Cu, is applied on pad 6 of first surface 31A of wiring board 31, and ball-shaped solder 5 is formed.

Further, by positioning and mounting electrodes (not shown) of first electronic component 4 such as semiconductor package and pad 6 of wiring board 31, and re-flowing, first electronic component 4 is bonded to first surface 31A of wiring board 31 by way of solder 5 (step S01).

Similarly, ball-shaped solder 5 is formed on pad 6 of second surface 31B of wiring board 31, and by positioning and mounting electrodes (not shown) of second electronic component 40 and pad 6 of wiring board 31, and re-flowing, second electronic component 40 is bonded to second surface 31B of wiring board 31 by way of solder 5 (step S02).

Figure 7B:
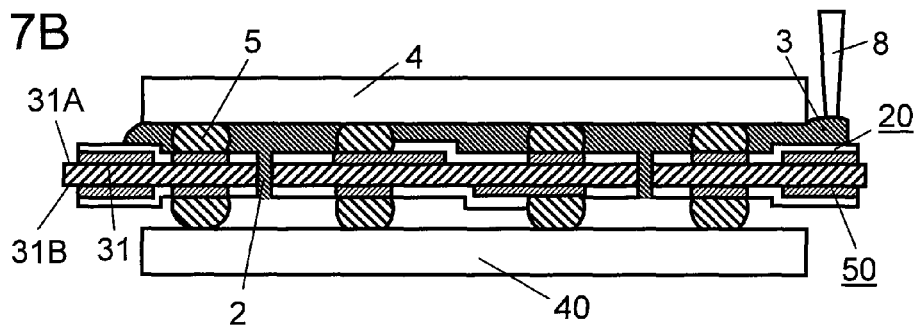
FIG. 7B is a sectional view explaining a manufacturing method of the mounted structural body in the second exemplary embodiment of the present invention.

Then, as shown in FIG. 7B and FIG. 8, using dispenser 8, from one position on first protrusion 20 surrounding the mounting position of first electronic component 4 on first surface 31A of wiring board 31, resin 3 such as epoxy resin is dropped, and injected. At this time, as explained in the first exemplary embodiment in FIG. 3B to FIG. 3D, resin 3 spreads in directions indicated by arrows along the region overlapping with first electronic component 4 and first protrusion 20, and fills up the gap of first electronic component 4 and first surface 31A of wiring board 31 (step S03). At this time, part of injected resin 3 may flow into through-hole 2, and may reach up to second surface 31B depending on the condition.

Figure 7C:
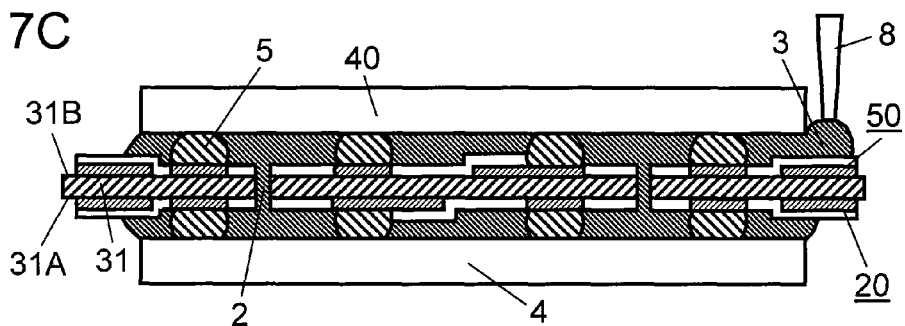
FIG. 7C is a sectional view explaining a manufacturing method of the mounted structural body in the second exemplary embodiment of the present invention.

Next, as shown in FIG. 7C and FIG. 8, wiring board 31 mounting first electronic component 4 and second electronic component 40 is turned upside down, and second surface 31B comes to the upside. As explained in FIG. 7B, using dispenser 8, from one position on second protrusion 50 surrounding the mounting position of second electronic component 40 on second surface 31B of wiring board 31, resin 3 such as epoxy resin is dropped, and injected. At this time, resin 3 spreads in the region overlapping with second electronic component 40 and second protrusion 50, and fills up the gap of second electronic component 40 and wiring board 31 (step S04). At this time, the inside air is forced out from the resin injection side to the release side.

In FIG. 7B and FIG. 7C, same as explained in the first exemplary embodiment, the gap of the first protrusion and the first electronic component, the second protrusion and the second electronic component is narrower than the corresponding inside gap, and is formed uniformly at the same height on the whole circumference of the first electronic component and second electronic component. Hence the resin flows by capillary action in the overlapped region of first electronic component and first protrusion and second electronic component and second protrusion, and injected smoothly.

Figure 7D:
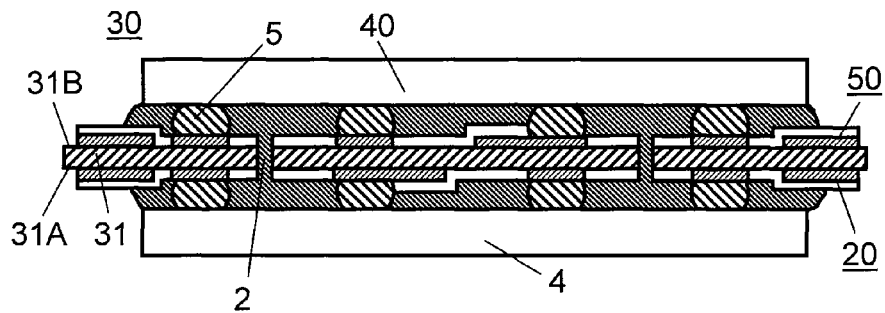
FIG. 7D is a sectional view explaining a manufacturing method of the mounted structural body in the second exemplary embodiment of the present invention.

Finally as shown in FIG. 7D, and FIG. 8, resin 3 is heated to a specified curing temperature (for example, about 80° C.), and resin 3 is cured in batch (step S05). As a result, mounted structural body 30 mounting first electronic component 4 and second electronic component 40 on first surface 31A and second surface 31B of wiring board 31 is manufactured.

According to the exemplary embodiment, the resin first flows into the gap of the first protrusion and first electronic component of the wiring board and into the gap of the second protrusion and second electronic component, and then the resin flows into the corresponding inside gap. As a result, the resin is securely injected into the peripheral parts of the outer circumference of the first electronic component and second electronic component, and the bond strength and the peel strength of the first electronic component and the wiring board, second electronic component and the wiring board are enhanced, and the mounted structural body excellent in connection reliability is realized.

In this exemplary embodiment, the first electronic component and second electronic component are mounted on first surface and second surface of the wiring board, and are bonded integrally by curing the resin by way of the through-hole. As a result, the curing shrinkage of the resin acts in the direction of bonding the first electronic component and second electronic component integrally, and the bond strength is further enhanced, and the mounted structural body excellent in reliability is manufactured. Further, warp of the wiring board due to difference in coefficient of thermal expansion of the mounted component elements is substantially suppressed by disposing the component elements symmetrically, so that a thin type mounted structural body may be realized.

Other examples explained in the first exemplary embodiment may be also applied in this exemplary embodiment.

Third Exemplary Embodiment

Figure 9A:
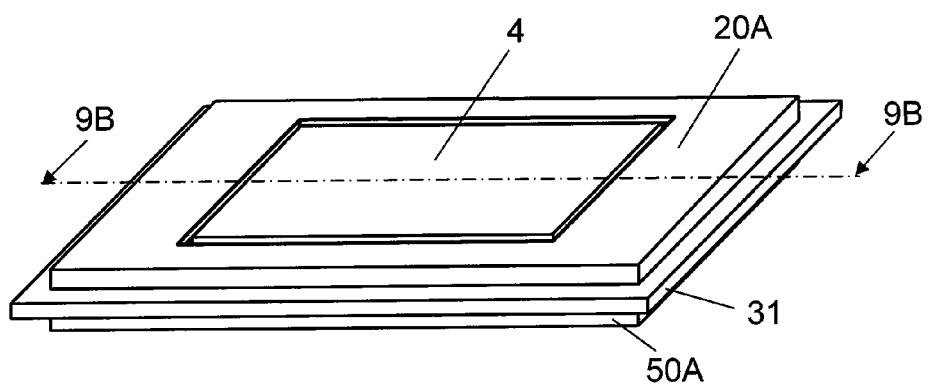
FIG. 9A is a perspective outline view of configuration of a mounted structural body in a third exemplary embodiment of the present invention.
Figure 9B:
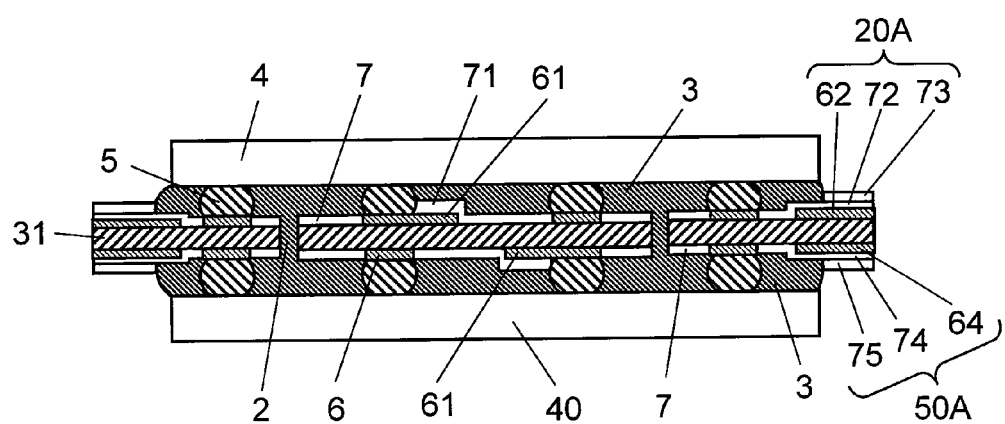
FIG. 9B is a sectional view along line 9B-9B in FIG. 9A.
Figure 10A:
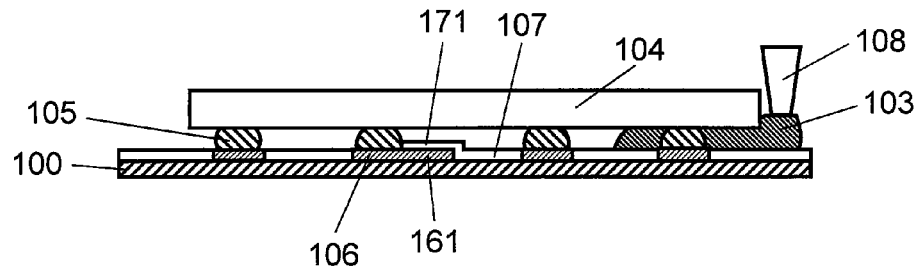
FIG. 10A is a sectional view explaining a method of injecting a resin between a wiring board and a semiconductor chip in a conventional mounted structural body.
Figure 10B:
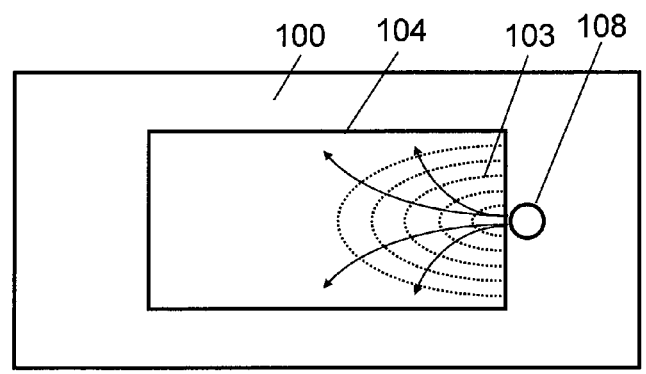
FIG. 10B is a sectional view explaining a method of injecting a resin between a wiring board and a semiconductor chip in a conventional mounted structural body.
Figure 10C:
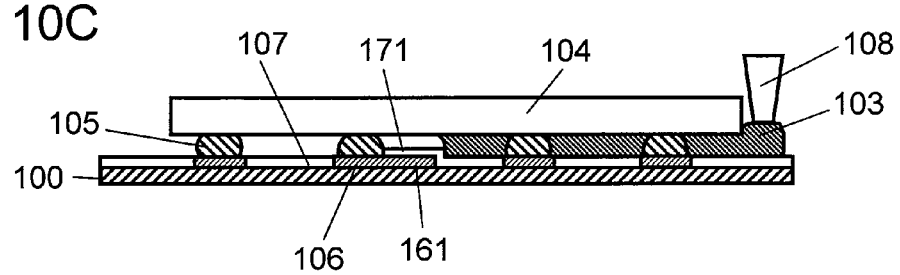
FIG. 10C is a sectional view explaining a method of injecting a resin between a wiring board and a semiconductor chip in a conventional mounted structural body.
Figure 10D:
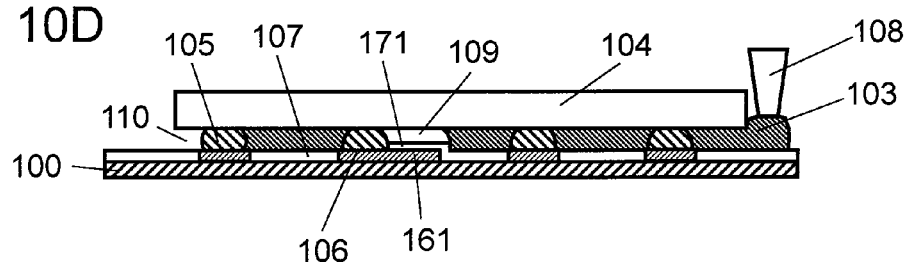
FIG. 10D is a sectional view explaining a method of injecting a resin between a wiring board and a semiconductor chip in a conventional mounted structural body.

FIG. 9A is a perspective outline view of configuration of a mounted structural body in a third exemplary embodiment of the present invention, and FIG. 9B is a sectional view along line 9B-9B in FIG. 9A.

As shown in FIG. 9A and FIG. 9B, this is different from the second exemplary embodiment in that the sectional shape of the first protrusion and second protrusion is formed in a stepped-shapes.

That is, as shown in FIG. 9A and FIG. 9B, on insulation film 72 of first protrusion 20 of the first exemplary embodiment and insulation film 74 of second protrusion 50, further, insulation film 73 and insulation film 75 of square frame shape larger than the outer size of first electronic component 4 and second electronic component 40 are provided, and first protrusion 20A and second protrusion 50A of stepped-shape in section are provided, and mounted structural body 80 is composed. At this time, insulation films 73, 75 are formed on insulation films 72, 74 at a height of about 30 μm, for example, by photolithography.

The other structures, materials, and manufacturing method are same as in the second exemplary embodiment, and the duplicate explanation is omitted.

According to the exemplary embodiment, insulation films 73, 75 of first protrusion 20A and second protrusion 50A are useful for preventing resin 3 from spreading to outside from the outer circumference of first electronic component 4 and second electronic component 40. In particular, in the curing process of resin 3, its effect is greater if the viscosity of resin 3 drops.

According to the exemplary embodiment, resin 3 is formed in a favorable fillet shape along the outer circumference of first electronic component 4 and second electronic component 40. As a result, the mounted structural body further excellent in the bond strength and the peel strength is realized.

The size of the frame formed by insulation film 73 and insulation film 75 is not particularly specified as far as larger than the outer circumference of first electronic component 4 and second electronic component 40. At this time, at least at the position for injecting resin 3, preferably, the size is larger than the size of the discharge port of resin of the dispenser.

The same effects are obtained when this exemplary embodiment is applied in the mounted structural body of the first exemplary embodiment or second exemplary embodiment.

Various examples explained in the first exemplary embodiment may be also applied in this exemplary embodiment.

What is claimed is:
1. A mounted structural body comprising:
a wiring board having an electronic component mounted at least on a first surface,
a resin applied at least between the electronic component and the wiring board, and
a through-hole provided in a region corresponding to the mounting position of the electronic component in the wiring board,
wherein a protrusion is formed on the wiring board so that at least a portion of the protrusion overlaps at least with a portion of a lower surface of the electronic component, around a region corresponding to the mounting position of the electronic component,
the protrusion is composed of a peripheral conductor part disposed on the wiring board, and an insulation film covering the peripheral conductor part,
the peripheral conductor part being continuously formed on an entire circumference of the electronic component, and
wherein the electronic component is a first electronic component, and the protrusion is a first protrusion, the mounted structural body further comprising:
a second electronic component mounted on a second surface opposite to the first surface of the wiring board, and
a second protrusion provided in the wiring board so as to overlap at least with the second electronic component, around a region corresponding to the mounting position of the second electronic component, together with a resin applied between the second electronic component and the wiring board.

2. The mounted structural body of claim 1, wherein the peripheral conductor part is formed of the same conductive material as a pad or wiring pattern for connecting the first electronic component on the wiring board.

3. The mounted structural body of claim 1, wherein the first protrusion is formed in a square frame shape.

4. The mounted structural body of claim 3, wherein corners of at least an inner circumferential side of the square frame shape are formed in curved parts.

5. The mounted structural body of claim 3, wherein corners of at least an inner circumferential side of the square frame shape are formed in flat parts.

6. The mounted structural body of claim 1, wherein the first protrusion has a stepped-shape in section.

7. A mounted structural body comprising:
a wiring board having an electronic component mounted at least on a first surface,
a resin applied at least between the electronic component and the wiring board, and
a through-hole provided in a region corresponding to the mounting position of the electronic component in the wiring board,
a protrusion formed on the wiring board and composed of a peripheral conductor part disposed on the wiring board, and an insulation film covering the peripheral conductor part,
wherein a portion of each of the peripheral conductor part and the insulation film overlaps at least with a portion of a lower surface of the electronic component, around a region corresponding to the mounting position of the electronic component, and
wherein the electronic component is a first electronic component, and the protrusion is a first protrusion, the mounted structural body further comprising:
a second electronic component mounted on a second surface opposite to the first surface of the wiring board, and a second protrusion provided in the wiring board so as to overlap at least with the second electronic component, around a region corresponding to the mounting position of the second electronic component, together with a resin applied between the second electronic component and the wiring board.

8. The mounted structural body of claim 7, wherein the peripheral conductor part is formed of the same conductive material as a pad or wiring pattern for connecting the first electronic component on the wiring board.

9. The mounted structural body of claim 7, wherein the first protrusion is formed in a square frame shape.

10. The mounted structural body of claim 9, wherein corners of at least an inner circumferential side of the square frame shape are formed in curved parts.

11. The mounted structural body of claim 9, wherein corners of at least an inner circumferential side of the square frame shape are formed in flat parts.

12. The mounted structural body of claim 7, wherein the first protrusion has a stepped-shape in section.

* * * * *